United States Patent [19]
Terry et al.

[11] Patent Number: 6,106,676
[45] Date of Patent: Aug. 22, 2000

[54] METHOD AND APPARATUS FOR REACTIVE SPUTTERING EMPLOYING TWO CONTROL LOOPS

[75] Inventors: Robert Terry, Livermore; Kevin Gibbons, Benicia; Sohrab Zarrabian, Santa Rosa, all of Calif.

[73] Assignee: The BOC Group, Inc., Murray Hill, N.J.

[21] Appl. No.: 09/061,578

[22] Filed: Apr. 16, 1998

[51] Int. Cl.[7] .................................................. C23C 14/34
[52] U.S. Cl. .............................. 204/192.13; 204/298.01; 204/298.08; 204/192.12; 204/192.15
[58] Field of Search ........................ 204/192.13, 298.03, 204/192.12, 192.15, 298.07, 298.08

[56] References Cited

U.S. PATENT DOCUMENTS

| | | | |
|---|---|---|---|
| 4,124,474 | 11/1978 | Bomchil et al. . | |
| 4,166,784 | 9/1979 | Chapin et al. | 204/192.13 |
| 4,201,645 | 5/1980 | Riegert . | |
| 4,407,709 | 10/1983 | Enjouji et al. | 204/192.13 |
| 4,428,811 | 1/1984 | Sproul et al. | 204/192.13 |
| 4,888,199 | 12/1989 | Felts et al. | 204/298.03 |
| 4,895,631 | 1/1990 | Wirz et al. | 204/192.13 |
| 4,936,964 | 6/1990 | Nakamura | 204/192.13 |
| 5,108,569 | 4/1992 | Gilboa et al. . | |
| 5,126,028 | 6/1992 | Hurwitt et al. | 204/192.13 |
| 5,292,417 | 3/1994 | Kugler | 204/192.13 |
| 5,556,520 | 9/1996 | Latz | 204/192.13 |
| 5,607,559 | 3/1997 | Yamada et al. | 204/192.13 |
| 5,618,575 | 4/1997 | Peter | 204/192.13 |
| 5,665,214 | 9/1997 | Iturralde | 204/192.13 |

OTHER PUBLICATIONS

Åström, Karl J. and Hägglund, Tore; *PID Controllers: Theory, Design, and Tuning;* Second Edition; Instrument Society of America; 1995.

*Primary Examiner*—Nam Nguyen
*Assistant Examiner*—Gregg Cantelmo
*Attorney, Agent, or Firm*—Philip H. Von Neida; Salvatore P. Pace

[57] ABSTRACT

The present invention is a cascade control system for reactive sputtering deposition. A first control loop modifies the power supply in order to keep a monitored value nearly constant. This first control loop can be done relatively quickly. A second control loop monitors a second measure parameter in order to control the reactive gas flow to the system. In a preferred embodiment, the slower control loop is used to maintain a relatively constant power at the power supply.

30 Claims, 4 Drawing Sheets

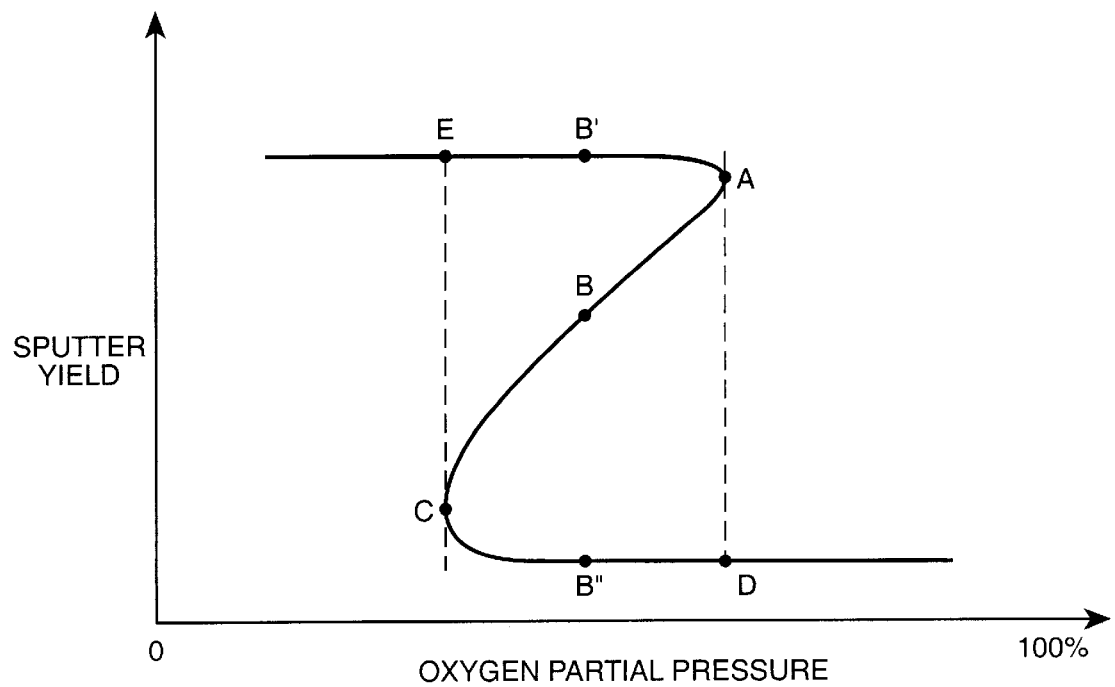
FIG._1A
(PRIOR ART)
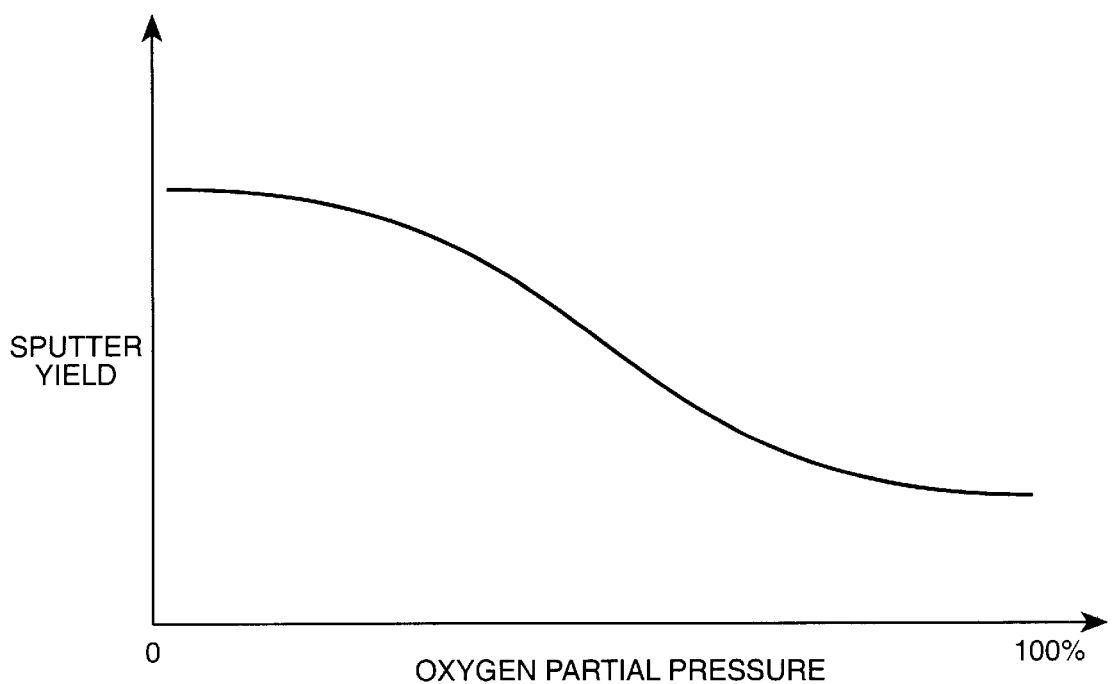
FIG._1B
(PRIOR ART)

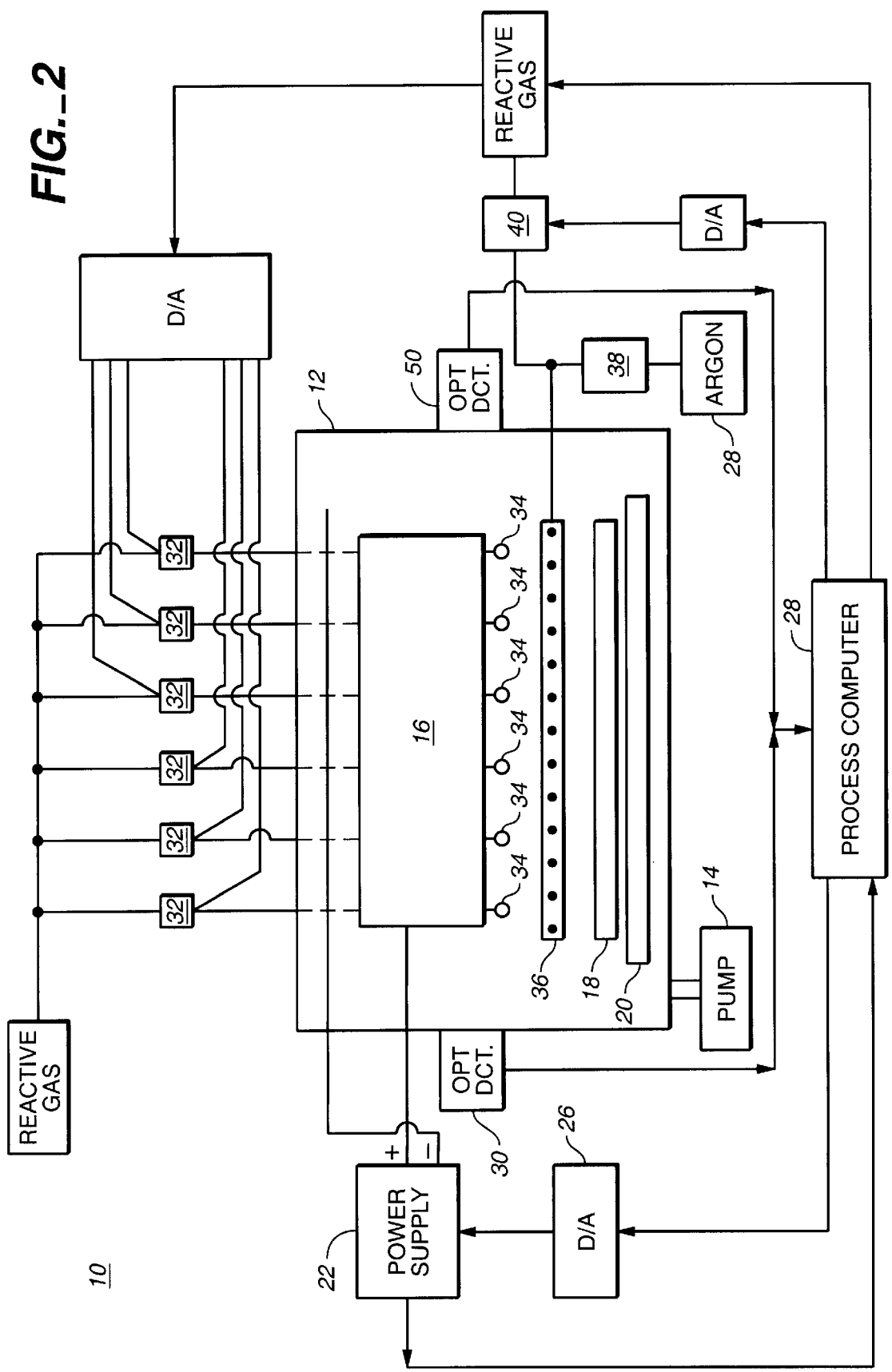
FIG._2

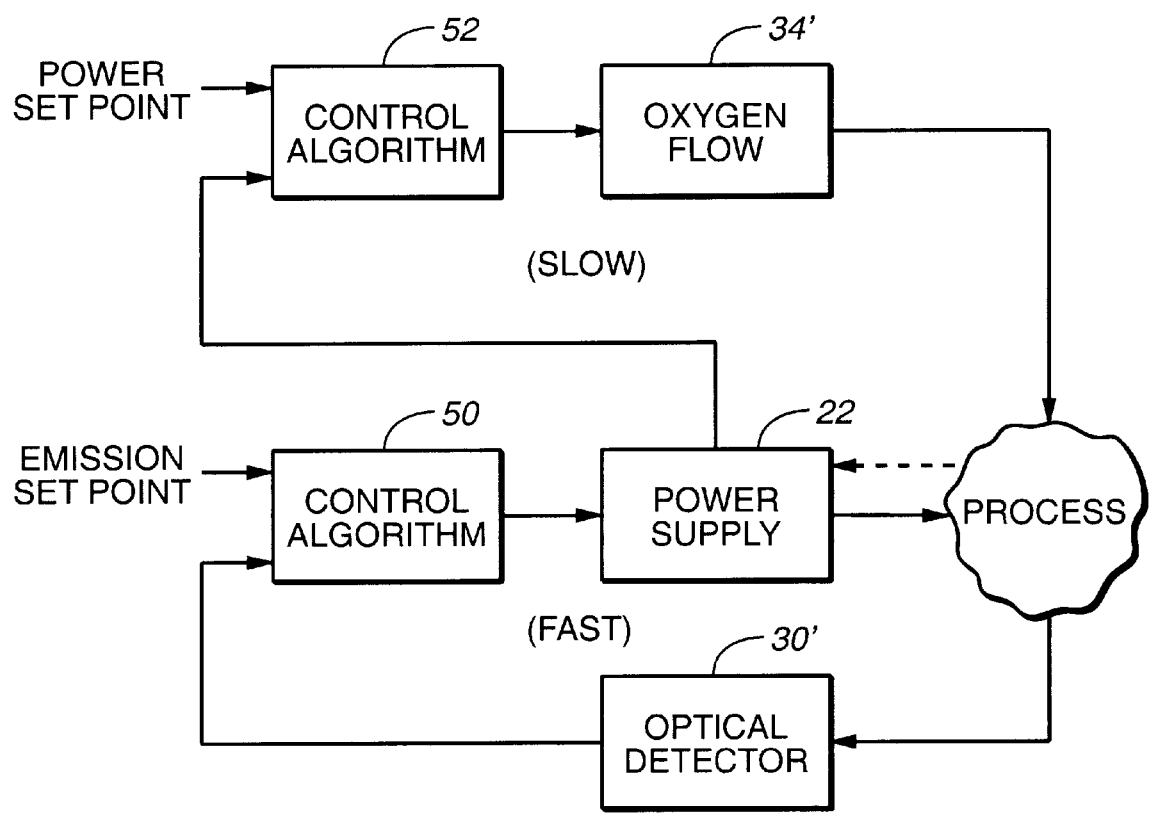
FIG._3

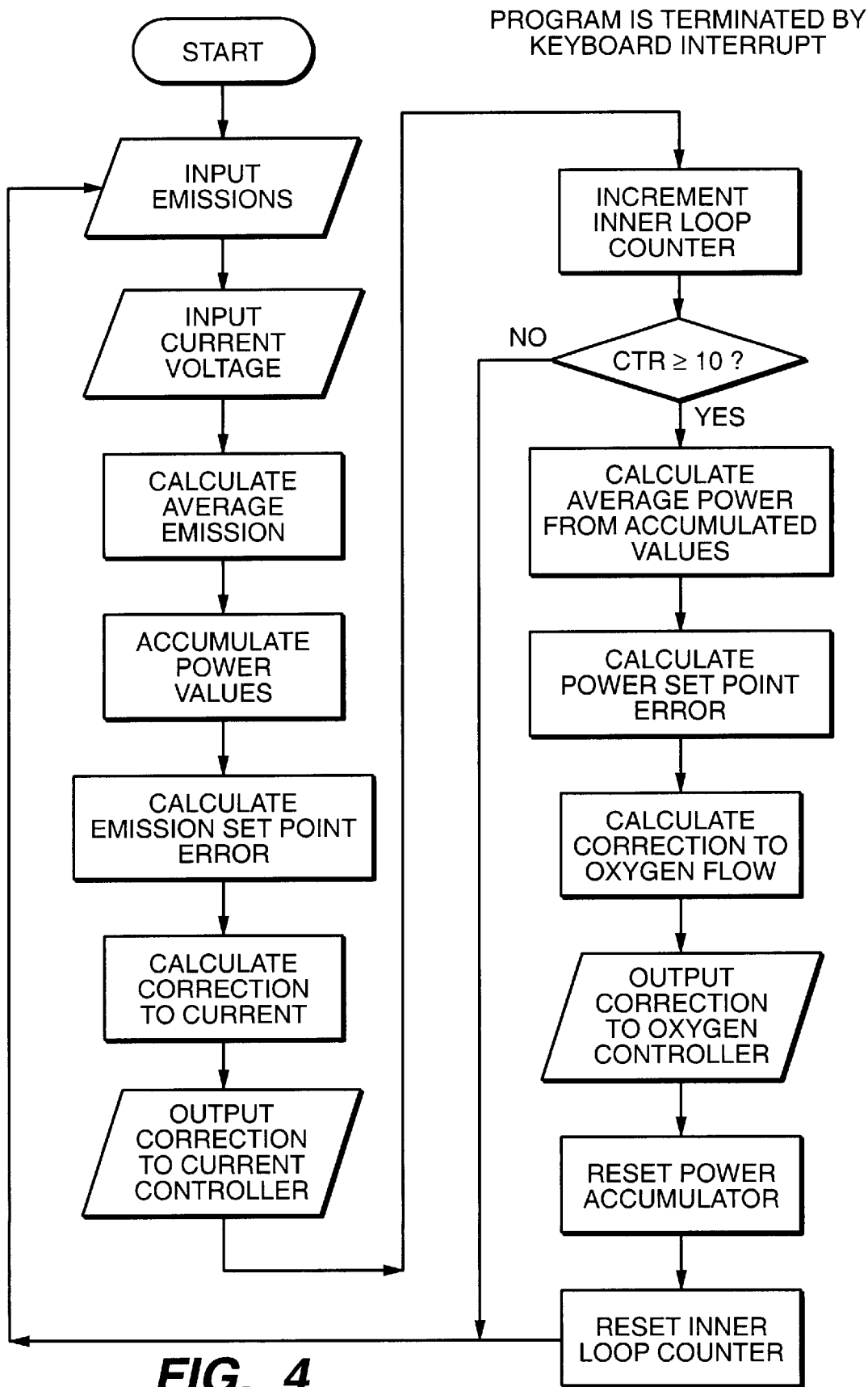
FIG._4

METHOD AND APPARATUS FOR REACTIVE SPUTTERING EMPLOYING TWO CONTROL LOOPS

BACKGROUND OF THE INVENTION

The present invention relates to control systems for sputter coaters. More particularly, the present invention relates to control systems for reactive sputter deposition systems.

Reactive sputter deposition is used to form layers such as titanium dioxide, silicon dioxide, tin oxide, zinc oxide, indium-tin oxide, silicon nitride, and titanium nitride. These layers are useful for a variety of applications, including optical coatings and semiconductor integrated circuits. In reactive gas sputter deposition systems, material is sputtered off of a target in a reactive gas environment. The reactive gas is oxygen to form oxides or nitrogen to form nitrides. These compound materials form layers on a substrate.

Reactive sputtering tends to have a low deposition rate compared to sputtering in a non-reactive environment. The low deposition rate for reactive sputtering is due to the target becoming coated with the formed compound as the gas reacts with the atoms on the target surface. The oxide or nitride coating on the target has stronger bonds to itself and the target material than the material of the target has to itself. Thus, more energy is required to break those bonds and sputter the dielectric material off of the target. For a given plasma power, fewer compound bonds will break than metal bonds; therefore, the deposition rate of the compound will be lower than that of the metal target.

Furthermore, the secondary electron emission coefficient of most oxides is higher than the corresponding metal. This also reduces the sputter rate of oxides. For example, the sputter rate of pure titanium is ten times faster than the sputter rate of titanium oxide.

The remainder of this discussion will focus upon the sputter deposition of titanium dioxide, although similar issues are involved with the sputter coating of other oxides or nitrides. When the target surface is free from the oxide coating, the sputter rate is high. An ideal process would supply just enough oxygen gas to produce a desired dielectric coating on the substrate without any oxygen gas remaining to contaminate or "poison" the target. Reaching this ideal is difficult because of "hysteresis" behavior.

FIG. 1A is a plot showing the effect of the reactive gas partial pressure on the sputter deposition rate. In this case, the reactive gas is oxygen. The abscissa axis represents the oxygen partial pressure as a percentage of the total gas pressure, with the balance being an inert sputtering gas, typically argon. The ordinate axis represents the sputter yield in arbitrary units. In a pure argon environment (i.e. when the oxygen partial pressure is 0%) the sputter yield is high and a pure metal film is deposited. As the oxygen partial pressure is increased (and argon partial pressure reduced so that the system pressure remains constant), the sputtering target begins to become oxidized. As long as oxygen partial pressure is low enough, the sputter process removes the oxide as quickly as it is formed. The sputter process acts as a pump for the oxygen gas, consuming a large percentage of the available oxygen gas which is incorporated into the coating. The sputter yield will remain approximately constant during this process. This process occurs between points (E) and (A) in FIG. 1A. At some point (A), the oxygen partial pressure will be high enough that the oxide forms on the target surface faster than the process can remove it. At this point, the target develops an oxide skin and the sputter yield decreases dramatically. This process is illustrated in FIG. 1A by the dashed lines showing the transition from point (A) to point (D). When the sputter yield has decreased, the process can no longer use the large amount of oxygen gas which was required when the sputter yield was so much higher. Because the sputter yield is lower, the "pumping efficiency" of the target is greatly reduced. The excess oxygen is partially incorporated into a thicker oxide layer on the target surface, with the balance contributing to an increase of thirty percent or more in total system pressure. Coatings produced under these conditions have dielectric, optically clear properties.

If one begins the process by sputtering a target in a pure oxygen environment (i.e. when the oxygen partial pressure is 100%) the target is oxidized; the sputter yield is low; and the coatings have optically clear, dielectric properties. As the oxygen partial pressure is reduced (and argon partial pressure increased so that the system pressure remains constant), the process remains in the oxidized state until there is an insufficient amount of oxygen gas to replenish the oxide coating of the target which is slowly removed by the sputtering process. This process occurs between points (D) and (C) in FIG. 1A. At some point (C), the target has bare metal exposed and the sputter yield increases back to the level of the metal process. The process is illustrated by the dashed lines showing the transition from point (C) to point (E). As the target consumes the oxygen gas, there is an oxygen deficiency in the system. This deficiency causes even more bare metal to be exposed on the target, which further increases the pumping efficiency of the target. As a result, the system pressure decreases dramatically, falling by thirty percent or more.

The transitions illustrated by the dashed lines in FIG. 1A can occur in less than a second; far too fast for a human operator to adjust the oxygen flow. Ideally, the process should be maintained at some condition between the two transitions, indicated in FIG. 1A by point (B). At this midpoint, the deposition rate is almost as high as that of the metallic process, and the coating properties are close to those of films produced in pure oxygen. The difficulty is that the process at point (B) is highly unstable. The process will move to either point (B') or point (B") under the slightest perturbation. Even if an operator were quick enough to respond to a change, he would not know which way the process was going, oxidized or metallic, until it was too late.

The simplest approach to maintaining the reactive sputtering process within the desired area of the hysteresis region is to increase the pumping of the vacuum system to a degree that the perturbation in the gas consumption due to changes in the target oxidation state is small compared to the amount of gas consumed by the vacuum pump. This has the effect of changing the response curve to that shown in FIG. 1B. The hysteresis is completely eliminated and process control is straightforward. This technique has been used on small research coaters and some production systems but is typically considered too expensive to use with full-size production coaters.

The second approach is to reduce the oxygen partial pressure at the target through the use of baffles, tailored gas introduction systems, etc. The goal of this approach is to maintain an argon-rich environment in the immediate vicinity of the target surface, thus ensuring a high deposition rate. The oxygen is concentrated near the substrate to produce a fully oxidized coating. Sometimes the oxygen is activated with a second plasma source to promote reactivity with sputtered metal. S. Maniv, et al., reported this technique for the deposition of zinc and indium-tin oxides in 1980. (S. Maniv and W. D. Westwood, J. Vac. Sci. Technol. 17,743 (1980)).

A third approach is to closely regulate the amount of oxygen admitted to the process via a closed-loop control system. The process is held at point (B) in FIG. (1A) and as soon as any small perturbation is detected, the control system immediately responds by adjusting the amount of oxygen admitted to the system. The oxygen flow to the target area is regulated based on a measured parameter such as optical emissions or target cathode voltage. An example of this type of system is described in a paper by S. Berg., et al. (S. Berg, H. O. Blom, M. Moradi, C. Nender and T. Larson, Process Modeling of Reactive Sputtering, J. Vac. Sci. Technol. A7(3), 1225 (1989)). In these types of systems, typically precision control of the reactive gas is required to control the process. In order to minimize the response time, the gas valves are located as close as possible to the target, with minimal plumbing between the valve and target. Additional gas tubing after the valve would introduce delays in the gas transport. Sophisticated control valves such as piezo-electric valves, are typically used to provide the fast response time required.

It is desired to have an improved method for controlling the reactive sputtering process within the hysteresis region.

SUMMARY OF THE INVENTION

The inventors have found that controlling the reactive sputtering process using two control loops, each changing a different input of the system, can help provide an improved performance of the reactive sputtering process. A preferred embodiment of the present invention uses an inner (fast) loop and an outer (slow) loop.

The fast loop controls the current at the target. The reactive sputtering process state can be controlled by modifying the electrical current driving the sputtering target as well as by modifying the amount of reactive gas added to the system. Increasing the power supply current decreases the oxidation state of the target, just as decreasing the amount of oxygen would.

In the present invention, a system parameter is monitored and the power supply current level at the target is manipulated in order to maintain the indication constant. This forms an inner control loop which operates at a high speed relative to that of the outer control loop that controls the gas flow. As the reactive gas is introduced into the process, the deposition rate will decrease, causing a change on the inner loop measured parameter. The current level control loop will respond by increasing the current density.

The measured parameters are preferably monotonically related to the sputter rate. In the case of the titanium dioxide process, the optical emission of a titanium metal transition is used. In a preferred embodiment, the optical emission transition at about 500 nanometers can be used. For the case of silicon dioxide, the voltage at the target can be used. As the measured parameter varies from an empirically determined setpoint, the control system makes very small changes to the power supply current. For example, as the target becomes oxidized, the optical emission of the titanium decreases, indicating a decrease in the sputter rate. The fast control loop causes the power supply current to increase, which increases the removal of oxides from the target, increasing the sputter rate. If the target becomes metallic, the optical emission of titanium increases. The fast control loop causes the power supply current to decrease, allowing a slight amount of oxide to build up on the target surface. This inner (fast) loop can be executed very quickly, such as once every five milliseconds (200 Hz). As the inner loop controls the power supply current to maintain the correct oxidation state of the target, the power and thus the deposition rate may vary. The outer (slow) control loop monitors the average power over a longer time period, such as a period of one second. If the average power deviates from a pre-established power setpoint, the outer control loop changes the concentration of the oxygen gas. This induces a change in the optical emission of titanium, causing a response by the inner control loop.

If the average power has decreased from the desired power setpoint due to the inner control loop, the outer control loop will increase the amount of oxygen gas introduced to the process. This will suppress the optical emission of titanium. The inner control loop will react to this change by increasing the power supply current to restore the proper level of the optical emission of titanium and therefore restore the oxidation state of the target. Likewise, if the average power has increased above the desired setpoint, the outer loop will decrease the amount of oxygen gas supplied to the process. This will cause the optical emission of titanium to increase, as the target becomes more metallic. The inner fast control loop will rapidly respond to the change by reducing the current, causing the average power to be reduced.

In a preferred embodiment, both the inner and outer control loops are based upon a proportion-integral-derivative control algorithm. Alternately, other control algorithms such as predictive-based or fuzzy-logic-based systems can be used.

The present invention has a number of advantages over prior art single-loop control systems for reactive sputtering and deposition. Prior single-loop control systems for reactive sputtering deposition typically use the gas flow to control the system. In large coaters, controlling the reactive gas flow at the target surface is typically a slow process. Even if flow control valves are located near the target, the gas transport time could be on the order of a second or more. When the flow controllers are centrally located, the change of the reactive gas concentrations at the target can take as much as several seconds. In this situation, a single-loop control system cannot operate quickly enough to provide adequate rate enhancement.

This is especially a problem when high sputter powers are used. As the sputter power is increased, the time constants of the hysteresis effect decrease. Therefore, the reactive sputtering process is much more unstable at higher powers. At some point, even in an ideal single loop system, the gas transport delays become too large for the process control.

In the present invention, the adjustments of the power supply provide the quick changes needed for adequate process control, regardless of the coater size. Small changes in the electrical system can be made much more quickly than changes for gas input.

The invention uses the responsiveness of the power supply electronic circuitry to have a fast control while relying on the gas flow controllers to respond on the order of seconds to maintain an average constant sputter power. The cascade control system of the present invention allows process control at a higher sputter power than is capable with a single-loop reactive gas control system.

The present invention can be used to form compound layers other than $TiO_2$ including titanium nitride, $SiO_2$, $SnO_2$, ITO, $Si_3N_4$, $ZrO_2$, $HfO_2$, $Nb_2O_5$, and the various oxides of vanadium.

BRIEF DESCRIPTION OF THE DRAWINGS

The above and other features and aspects of the present invention will become more apparent upon reading the following detailed description in conjunction with the accompanying drawings.

FIG. 1A is a prior art graph of oxygen partial pressure vs. sputter yield.

FIG. 1B is a prior graph of oxygen partial pressure vs. sputter yield when the vacuum chamber is highly pumped.

FIG. 2 is a diagram of the reactive sputtering system of the present invention.

FIG. 3 is a diagram illustrating the preferred embodiment of the cascade control system of the present invention.

FIG. 4 is a flow chart of a computer program used to implement a cascading control system of the present invention.

DETAILED DESCRIPTION OF THE PREFERRED EMBODIMENT

FIG. 2 is a diagram of the reactive sputtering system 10 of the present invention. The system 10 includes an evacuable chamber 12, pump 14, target 16 and a substrate 18 on a conveyor 20. In the system 10, material is sputtered off of the target 16. For titanium oxide and titanium nitride deposition, the target 16 is made of titanium. For silicon dioxide or silicon nitride, the target 16 is made of silicon with a small doped amount of another material such as aluminum or boron. The reactive sputter deposition of titanium dioxide is discussed for the remainder of this description.

In a preferred embodiment, a DC power supply 22 is used. The negative (cathode) end of the power supply 22 is connected to the target 16. The positive (anode) end of the power supply 22 is connected to a suitable anode in the chamber 12. The anode can for example be a wire-brush anode, a chamber anode or a virtual gas anode such as that described in the patent application "Gas Purged Electrodes," Ser. No. 08/679,288 filed Jul. 12, 1996, incorporated herein by reference.

An example of a power supply which can be used with the present invention is a Halomar 60 kilowatt power supply. The Halomar power supply is controlled by a zero to five volt input signal. If necessary, this signal may be filtered to reduce transmission noise. The output signal from the processor 28 is sent to D/A converter 26 to provide an analog input control for the power supply 22. The response time of this system is on the order of ten milliseconds.

The method and apparatus of the present invention can also work with an AC power supply. When an AC power supply is used, the control signal can control the root mean squared (RMS) current or the peak current.

Argon is supplied to the chamber 12 by argon supply 28 via a distribution bar 36. The argon is controlled by a mass flow controller 38. The reactive gas is supplied to the chamber 12 by two paths. The bulk of the reactive gas is introduced via the distribution bar 36. The flow of this gas is controlled by a mass flow controller 40 which is controlled by the process computer in response to fluctuations in the power supply power. Alternately, multiple gas flow controllers and ports can be used rather than using a distribution bar 36. The balance of the reactive gas is supplied to the chamber via flow controllers 32. These flow controllers 32 are preferably computer-controlled mass-flow controllers, which may either flow a fixed amount or respond to power fluctuations in the power supply. The relative gas flow through each of the inlets 34 can be tuned by adjusting the flow controllers 32. In this way, the uniformity of the coating can be tuned across the target width. In one embodiment, the ports 34 are evenly distributed about the target width. Typically, the end ports must supply more oxygen than the central ones, possibly due to pumping or edge effects.

The present invention preferably uses an optical detector 30 to detect some optical emission of an element which relates to the sputtering efficiency. The optical emission and sputtering efficiency can be directly or inversely related depending on the monitored element. In one embodiment, for a titanium dioxide deposition control system, the optical detector 30 is used to detect an emission line characteristic of titanium. In a preferred embodiment, optical emissions of about 500 nanometers are detected. In a preferred embodiment, the optical detector 30 includes a telescope assembly to collect the light from the plasma at either end of the target and deliver it to the photo-multiplier tube. The telescope assembly is designed as a light collector and does not produce an image at the surface of the detector. A purge gas flows within the telescope assembly and in front of the window of the chamber. The purge gas prevents the telescope assembly and window from being coated. The purge gas can be either argon, oxygen or a combination. In a preferred embodiment, the purge gas is a mixture of argon and oxygen which approximates the mixture in the sputter chamber. The telescope assembly is also connected to the optical band pass filter. In a preferred embodiment, the optical band pass filter is centered at 500 nanometers with a five nanometers half-height. A photo-multiplier module is attached to receive light from the telescope assembly. The module consists of a photo-multiplier tube, a high-voltage power supply, and an anode-biasing network. The photo-multiplier tube can be calibrated by sputtering the titanium target in pure argon at some known power level for at least fifteen minutes, or until the optical emission signal is stable. The output trim pot is adjusted until the emission count through the 500 nanometer optical band pass filter is at a predetermined level. As an example, the output can read 800 counts as sent to the control computer 28. Using this procedure, a desired setpoint for the reactive deposition of titanium dioxide in argon and oxygen at 40 kilowatts would be an emission count of 760. The data acquisition and process control are done through the processor 28. The processor 28 could be part of a desktop computer. The incoming signals to the computer are preferably low-pass filtered. In a preferred embodiment, the incoming signals are filtered in a 5B30 series module filter which isolates the signal from a data acquisition system, provides a computer-controlled gain, and serves as a 4 Hz low-pass filter. This type of module is available from a number of manufacturers, including Analog Devices, omega Engineering and National Instruments. Filtering is important due to the large levels of noise from the plasma, power supply and surrounding equipment. From the signal processing module, the signal is sent to a data acquisition board, such as an AT-DAQ-16 manufactured by National Instruments. The data is acquired and recorded, including the optical emission signal from the optical detector 30, the voltage and current from the power supply, the chamber pressure as reported by a capacitance manometer (not shown). The signal from the optical detector 30 can be carried on coaxial cables with BNC connectors. The signals to and from the power supply can be transmitted by a shielded twisted-pair wire, of preferably a 20 or 22 gauge. In a preferred embodiment, the data acquisition and control is performed through an industrial Programmable Logic Controller such as an Allen-Bradley SLC-500.

FIG. 3 is a diagram illustrating the cascade control logic of the present invention. This fast control loop compares the optical emission signal from detector 30 with an emission setpoint using a control algorithm 50. The control algorithm 50 provides adjustments to the power supply 22. The optical emission setpoint is empirically determined by producing a number of samples at various setpoints and analyzing their optical properties. The higher the optical emission value, the faster the process, but the more metallic the coating. By empirical testing, the user can determine an optical emission setpoint value with a high deposition speed but which still maintains the desired optical qualities. In one preferred embodiment, the optical emission setpoint is about twenty-five percent of the optical emission intensity when a titanium target is sputtered in pure argon at the operating power level.

The cycle time of the fast loop is preferably from one to fifty milliseconds, and in a preferred embodiment is twenty-five milliseconds. During each cycle, the optical emission level of titanium from the optical detector 30' is measured and the output signal from the computer is sent to the power supply to adjust the current which brings the optical emission signal closer to the optical emission setpoint. In general, this fast loop will maintain the optical emission signal within approximately one percent of the setpoint when the power supply is operating at forty kilowatts. The outer slow loop maintains the power at a desired level by measuring the current, voltage and/or power from the power supply controller and manipulating the oxygen flow in the process to bring the power to a desired setpoint. As an illustration, consider the case when the measured power is slightly below the desired setpoint. The controller will increase the oxygen flow to all of the gas controllers. As oxygen flow is increased, the optical emission of titanium is suppressed. The inner control loop reacts to this change in emission very quickly by increasing the power supply current to bring the optical emission level back to the setpoint. The inner loop completes multiple cycles for each cycle of the outer loop. The net result is the current and, hence, the power is increased when the oxygen flow is increased. The outer loop could also decrease the argon flow for a similar effect.

The gain of both control loops is scheduled during the startup to make the startup process smoother. A low process gain is used during startup to reduce overshoot, until the process is close to the operating conditions. Once the process has reached the operating conditions at full power and excursions from the setpoints are small, higher gains are used to maintain tighter process control with minimal overshoot.

FIG. 4 is a flow chart of the computer program used to implement the control algorithms of the present invention. In one embodiment, the control algorithms are implemented as proportion-integral-derivative (PID) control algorithm. This system works as follows. A present error valve is produced. The present error is the present value of the controlled variable minus the desired value (setpoint value). The change-in-the-error value is the present error minus the previous error. The rate of change of the error is the change in error over the time interval between samples. The present error and the previous sum of the error are combined to form the current sum of the error or error integral. The present error is multiplied by the proportion constant. The error integral is multiplied by the integral constant. The rate of change of the error is multiplied by the derivative constant. These three values are then added and multiplied by a gain constant to produce the change in the output value. The integral, proportion, and derivative constants are measures of the contribution of each type of control to the total. The overall gain constant is a measure of the overall aggressiveness of the control system. The choice of the proportion constant, integral constant, and derivative constant, as well as the gain constant, are done in order to provide good system operation. A basic description of the PID algorithm is given in the book *PID Controllers: Theory, Design, and Tuning*, Second Edition, K. Åström et al., Instrument Society of America (1995), which is incorporated herein by reference. In an alternate embodiment, other types of control systems could be used.

Various details of the implementation and method are merely illustrative of the invention. It will be understood that various changes in such details may be within the scope of the invention, which is to be limited only by the appended claims. For example, the measured second parameter can be related to the average film thickness of the deposited layer rather than the target power. The substrate carrier linespeed can then be adjusted to maintain a uniform deposition rate.

What is claimed is:

1. A method of controlling a reactive sputtering process in a sputter system, the sputter system housing a target and being supplied with power and at least one reactive gas, the method comprising:

sputtering the target;

controlling a parameter of a system power supply in view of a first process parameter; and controlling a parameter of a system gas supply in view of a second process parameter, wherein said controlling a power supply parameter and said controlling a gas supply parameter are responsive to one another.

2. The method of claim 1, wherein the first process parameter is related to optical emission.

3. The method of claim 2, wherein the power supply parameter is related to current and said controlling of the power supply parameter comprises increasing the current when optical emission has decreased.

4. The method of claim 1, wherein the first process parameter is related to voltage.

5. The method of claim 1, wherein the second process parameter is related to average power.

6. The method of claim 5, wherein said controlling of the gas supply parameter comprises increasing an amount of reactive gas when average power has decreased.

7. The method of claim 1, wherein said controlling of the power supply parameter and said controlling of the gas supply parameter occur in a first period and a second period, respectively, the first period being shorter than the second period.

8. The method of claim 1, wherein said controlling of the power supply parameter occurs in from one to fifty milliseconds.

9. The method of claim 1, wherein said controlling of the gas supply parameter occurs in from 100 to 1000 milliseconds.

10. The method of claim 1, wherein the target is composed of titanium and the reactive gas is oxygen.

11. The method of claim 10, wherein the first process parameter is related to optical emission and said controlling of the power supply parameter comprises monitoring for an optical emission characteristic of titanium.

12. The method of claim 1, wherein said controlling of the power supply parameter comprises comparing the first process parameter to a setpoint.

13. The method of claim 1, wherein said controlling of the gas supply parameter comprises comparing the second process parameter to a setpoint.

14. The method of claim 1, wherein at least one of said controlling of the power supply parameter and said controlling of the gas supply parameter comprises using a proportion-integral-derivative algorithm.

15. A method of controlling a reactive sputtering process in a sputter system, the sputter system housing a target and being supplied with power and at least one reactive gas, the method comprising:

sputtering the target;

monitoring a first process parameter;

modifying a first system parameter in response to the first process parameter;

monitoring a second process parameter; and modifying a second system parameter in response to the second process parameter, wherein said modifying a first system parameter and said modifying a second process parameter are responsive to one another.

16. The method of claim 15, wherein the first system parameter is related to current.

17. The method of claim 15, wherein the second system parameter is related to an amount of reactive gas.

18. The method of claim 15, wherein the first process parameter is related to optical emission.

19. The method of claim 15, wherein the second process parameter is related to average power.

20. The method of claim 15, wherein said modifying of the first system parameter and said modifying of the second system parameter occur in a first period and a second period, respectively, the first period being shorter than the second period.

21. The method of claim 15, wherein the target is composed of titanium and the reactive gas is oxygen.

22. A reactive sputtering system, comprising:

a chamber which houses a target;

a power supply for supplying power to the target;

a gas supply for supplying at least one reactive gas to the chamber; and a processor for controlling said power supply in view of a first parameter, and for controlling said gas supply in view of a second parameter, wherein controlling said power supply and controlling said gas supply are responsive to one another.

23. The system of claim 22, further comprising a detector for the first parameter, wherein the first parameter is related to optical emission.

24. The system of claim 23, wherein said detector comprises a photo-multiplier tube.

25. The system of claim 23, wherein the processor automatically controls said power supply to maintain the first parameter at, or to bring the first parameter to, a setpoint.

26. The system of claim 22, wherein the first parameter is related to voltage.

27. The system of claim 22, wherein the second parameter is related to an average power.

28. The system of claim 22, wherein the processor automatically controls said power supply and automatically controls said gas supply in a first period and a second period, respectively, the first period being shorter than the second period.

29. The system of claim 22, wherein the target is composed of titanium and the reactive gas is oxygen.

30. The system of claim 29, further comprising a detector for the first parameter, wherein the first parameter is related to optical emission and the processor automatically controls the power supply in view of an optical emission characteristic of titanium.

* * * * *